US009780722B1

(12) United States Patent
Wik

(10) Patent No.: US 9,780,722 B1
(45) Date of Patent: Oct. 3, 2017

(54) LOW-COST EFFICIENT SOLAR PANELS

(76) Inventor: Thomas Robert Wik, Livermore, CA (US)

( * ) Notice: Subject to any disclaimer, the term of this patent is extended or adjusted under 35 U.S.C. 154(b) by 1347 days.

(21) Appl. No.: 11/713,899

(22) Filed: Mar. 5, 2007

Related U.S. Application Data

(60) Provisional application No. 60/779,899, filed on Mar. 7, 2006.

(51) Int. Cl.
| | | |
|---|---|---|
| *H01L 31/00* | (2006.01) | |
| *F24J 2/40* | (2006.01) | |
| *F24J 2/38* | (2014.01) | |
| *H02S 40/20* | (2014.01) | |
| *H02S 40/00* | (2014.01) | |
| *H02S 40/22* | (2014.01) | |
| *F24J 2/02* | (2006.01) | |
| *H01L 31/054* | (2014.01) | |
| *H01L 31/0232* | (2014.01) | |
| *F24J 2/00* | (2014.01) | |

(52) U.S. Cl.
CPC ............. *H02S 40/22* (2014.12); *F24J 2/02* (2013.01); *F24J 2/38* (2013.01); *F24J 2/40* (2013.01); *H02S 40/00* (2013.01); *H02S 40/20* (2014.12); *F24J 2/00* (2013.01); *H01L 31/0232* (2013.01); *H01L 31/02322* (2013.01); *H01L 31/054* (2014.12); *H01L 31/0547* (2014.12); *Y02E 10/52* (2013.01)

(58) Field of Classification Search
CPC .......... H01L 31/0232; H01L 31/02322; H01L 31/054; H01L 31/0547; H02S 20/30; H02S 20/32; H02S 40/00; H02S 40/20; H02S 40/22; F24J 2/02; F24J 2/38; F24J 2/40; Y02E 10/52
USPC ......................................... 136/245
See application file for complete search history.

(56) References Cited

U.S. PATENT DOCUMENTS

| 4,021,267 | A | * | 5/1977 | Dettling | 136/246 |
| 4,131,485 | A | * | 12/1978 | Meinel et al. | 136/259 |
| 4,158,356 | A | * | 6/1979 | Wininger | 126/579 |
| 4,313,024 | A | * | 1/1982 | Horne | 136/253 |
| 4,350,837 | A | * | 9/1982 | Clark | 136/246 |
| 5,317,145 | A | * | 5/1994 | Corio | 250/203.4 |
| 6,498,290 | B1 | * | 12/2002 | Lawheed | 136/246 |
| 2004/0031517 | A1 | * | 2/2004 | Bareis | 136/246 |

* cited by examiner

Primary Examiner — Matthew Martin

(57) ABSTRACT

A solar panel that attains very low cost/Watt objectives is achieved by applying an optical concentrator with planar symmetry in combination with a simple 1-axis tracking system. The concentrator uses a Cassegrain optical system to provide moderate concentration factors that can be adjusted by varying the ratio of the focal lengths of the concave and convex reflecting surfaces. Concentrator dimensions can be scaled to any convenient size. They can be arrayed in parallel to form a solar panel that has the same form factor as a 1-sun solar panel. One-axis tracking is achieved by simply rotating the collector elements in synchronism so the sun is maintained in the plane of symmetry for each of the collector elements that comprise the panel.

6 Claims, 6 Drawing Sheets

LOW-COST EFFICIENT SOLAR PANELS

CROSS-REFERENCE TO RELATED APPLICATIONS

This application claims the benefit of provisional patent application Ser. No. 60/779,899 filed 2006 Mar. 7 by the present inventor.

FEDERALLY SPONSORED RESEARCH

Not Applicable

SEQUENCE LISTING OF PROGRAM

Not Applicable

BACKGROUND OF THE INVENTION

Field of Invention

This invention relates to low-cost efficient solar panels utilizing moderate concentration of incident solar radiation and single-axis tracking to improve cost per Watt of electrical energy conversion in a form factor compatible with standard solar panels.

Prior Art

Solar panels currently used to convert solar radiation to electrical energy typically employ photovoltaic cells without concentration of the sunlight. These systems are classified as 1-sun systems. In addition to 1-sun systems prior art also includes many techniques for concentrating sunlight in order to increase the electrical current generated per unit area of photovoltaic cells. In principle this can reduce the cost per Watt provided the concentration factor can be achieved at a cost that is low enough. In addition to the concentrating optics it is also necessary to employ tracking in order to gain an advantage from concentration. The concentrated solar radiation must be directed continuously onto the surface of the photovoltaic cells.

This need for tracking increases the cost of concentrating systems and increases the challenges associated with insuring high reliability over the required 30+ years the system is expected to operate without significant maintenance expenses. High concentration systems achieve concentration factors ranging from 100× to well over 1000×. This enables very high current generation per unit area of photovoltaic cell. This large factor also makes it economical to utilize more expensive photovoltaic cells with higher innate conversion efficiencies. Systems that achieve high concentration factors require optical systems with axial symmetry that enable concentration in two orthogonal directions such as that achieved by a conventional convex lens or magnifying glass. Axial symmetry of the optical system requires two-axis tracking in order to keep the sun's rays focused on the photovoltaic cells as the sun traverses the sky during its apparent diurnal motion. This necessitates a cumbersome tracking system with substantial cost, reliability, and aesthetic penalties.

Prior art such as the Concentrator Photovoltaic (CPV) technology developed by SolFocus in Palo Alto, Calif. uses lenses and mirrors to concentrate solar energy on photovoltaic cells thereby reducing the amount of photovoltaic area required to generate each Watt of electrical power. This in turn reduces the installed cost. This technology employs an optical system with axial symmetry that achieves very high concentration factors and as a result it has the disadvantage that it generates very high temperatures on the photovoltaic cells and it requires perfect alignment of the entire panel to the sun at all times. This necessitates 2-axis tracking and this requirement makes many potential applications such as residential installations impractical.

The moderato concentration achieved by this invention uses an optical system with planar symmetry and one-axis tracking. Concentration is achieved along one axis and concentration factors between 1 and 50 can be achieved. These systems only require that the tracking system keeps the position of the sun in the plane of symmetry rather than along the axis of symmetry. This greatly simplifies the tracking system and enables a compact mechanism that is compatible with the form factor for a standard 1-sun solar panel. This simplicity provides cost advantages in addition to robustness and wide applicability.

OBJECTS AND ADVANTAGES

This invention achieves an optimum tradeoff between concentration factor and the cost of optical concentration elements and tracking mechanisms. The collector achieves a moderately high concentration factor. It can easily be designed for any concentration factor within a wide range. This enables an optimized tradeoff between the optical quality requirements and cost. Higher concentration factors require better optical quality, which entails greater cost. Flexibility in concentration factor makes it possible to select the highest concentration factor consistent with the optical quality that can be achieved for any given low-cost manufacturing process. Highest possible concentration factors consistent with exceptionally low manufacturing costs enable cost effective leveraging of the cost of photovoltaic cells. Current output per unit area of photovoltaic cells can be increased significantly with a modest cost adder for the concentration optics and tracking system. This accomplishes the key object, which is lowest possible manufacturing cost per Watt of electrical energy generated.

The optical design of the collector element taught in this application enables collection of diffuse sky light as well as concentrated direct-beam sun light. Diffuse sky light contributes approximately 20 percent of the total radiation in the visible spectrum incident on each square meter of solar-panel surface; therefore, it is highly desirable to utilize this component of the incident solar radiation.

The low aspect ratio of the collector element reduces the height requirement for the optics. This is compatible with the form factor for 1-sun solar panels and enables use of this concentration system wherever a standard 1-sun solar panel could be used. The solar panel constructed of these collector elements is very robust and wind resistant. This solar panel has similar aesthetic properties to standard 1-sun panels so it can be used readily even in residential applications. This is contrasted with high-concentration systems that require two axis tracking and ungainly unsightly mounts that are subject to wind and other damage.

The tracking mechanism for the collector elements is very simple and robust. It can be manufactured at very low cost since it consists of simply rotating a group of parallel collectors in synchronism. One control is sufficient for all of the collectors that comprise a solar panel.

The construction of the collector elements enables a flexible modular approach for the photovoltaic cells. The area of these modules is smaller so yields will be higher. The physical construction also allows for efficient heat dissipation using a low-cost heat spreader for example.

SUMMARY

Cost is a major factor limiting the growth rate of solar-powered electricity generation. This invention employs inexpensive optical concentration of solar energy to minimize the cost per Watt-hour of electrical energy production. This cost reduction can help to spur more rapid development of this important renewable energy resource.

This invention uses different optical means for concentrating sunlight, but has the same advantage of reducing the photovoltaic cell area required to generate a given amount of electrical energy/unit time. This minimizes the cost/Watt. The optical concentration techniques employed are compatible with conventional solar panel form factors and do not require the orientation of the panel to track the motion of the sun. This avoids any restrictions on applications. Furthermore this solar concentration technology is very flexible and makes it possible, for example, to trade off some area efficiency for improved cost efficiency. Generally this is a good tradeoff because sunlight is very diffuse and there is often plenty of useable area for solar collection. This helps to address the major barrier to investment in solar electricity generation, which is the cost/Watt-hour compared to other alternatives for generating electrical power.

This invention improves the efficiency and lowers the cost of panels for collecting solar energy and converting it into electricity. The preferred embodiment employs a long concave reflecting surface that can be rotated to track the sun as it transits across the sky. This concave reflecting surface focuses the rays of the sun along a line that lies in the plane of symmetry of the reflecting surface. A second long reflecting surface that runs the length of the concave surface intercepts the rays reflected from the concave surface near this line of focus and reflects the rays back down to the bottom of the concave surface. Photovoltaic cells are positioned along the bottom of the concave surface and intercept the rays reflected from the second reflecting surface. The entire collector consisting of the concave and second reflecting surfaces can be rotated about an axis parallel to its length to allow the photovoltaic cells always to be optimally positioned for maximum light flux. The rotation of the collectors is controlled by a drive that tracks the position of the sun during it apparent motion across the sky. The solar panel is comprised of parallel rows of these collectors. Typically the panel is oriented such that the lengths of the concave reflecting surfaces are oriented in a North-to-South direction but this is not necessary. The drive controller that orients the collectors towards the sun can compensate for any orientation of the panel. This can be accomplished utilizing a programmed drive or a servo-controlled drive that continuously maximizes the electrical output of the panel.

Ideally the cross-section of the concave reflecting surface should be a parabola, but since the photovoltaic cells cover a large solid angle with respect to the second reflecting surface, tolerances for the optics are extremely relaxed. It is even possible to use a concave reflecting surface with a circular cross section and correct in the secondary (convex) reflecting surface for the resulting "spherical" aberration.

The objective of this invention is to generate the largest number of Watt-hours/day per unit area of photovoltaic cell consistent with low-cost collector optics and tracking. This is accomplished by focusing the maximum solar flux on the cells for the longest period of time.

Aligning the plane of symmetry of the reflecting surface in the direction of the sun increases the solar flux significantly during the early morning and late afternoon hours. Shading of adjacent rows of reflectors can be reduced by spacing the rows of reflectors further apart. This reduces the area efficiency of the solar panel (Watt-hours/day-meter$^2$), but for many applications area is not important. In most cases cost efficiency is more important than area efficiency. Panels can be manufactured with different spacings of reflector rows depending on the relative importance of cost efficiency and area efficiency for different applications or installations. Minimum spacing (maximum density) of rows can be used where area efficiency is important. Elevation (or altitude) of the local effective horizon at the installation site is also an important factor. If there are obstructions at the horizon, the advantage of wider spacings is lost.

It is also possible to adjust the heights of the rows of reflectors to minimize shadowing effects in early morning and late afternoon. For the case of a North-South orientation of the collectors, each reflector would have two vertical positions—one for morning hours and one for afternoon. In the morning reflectors on the east side of the panel would be set to their lower positions while reflectors on the west side are set to their higher positions. In the afternoon reflectors would move to their alternate positions. Positions are set so the height of the reflectors increases linearly from east to west or vice versa. This minimizes the shadowing of each reflector by its neighbor to the east or to the west.

The maximum flux that can be utilized is a function of the photovoltaic cells and the operating temperatures they can tolerate. The long continuous length of the reflectors lends itself very well to use of a heat spreader or to liquid cooling. The photocells can be bonded to a heat spreader or a cooling line with a high thermal conductivity material and a liquid cooling line can be incorporated under the photovoltaic cells. Liquid cooling could be used to provide a source of hot water thereby combining solar electricity generation with solar water heating in one highly efficient unit. The collection cross-section of the reflectors and the light flux concentration ratios can also be varied to accommodate different application situations. A solar panel for a flat roof, for example, would use reflectors with a wider cross section and higher flux concentration ratio than a panel installed at the optimum collection angle.

The very relaxed optical requirements make it possible to manufacture the optical and drive components of the solar panel very inexpensively.

DRAWINGS

Figures

DETAILED DESCRIPTION

Preferred Embodiment of the Solar Collector—FIGS. 1, 2A, 2B, 5, and 6

Figure 1:
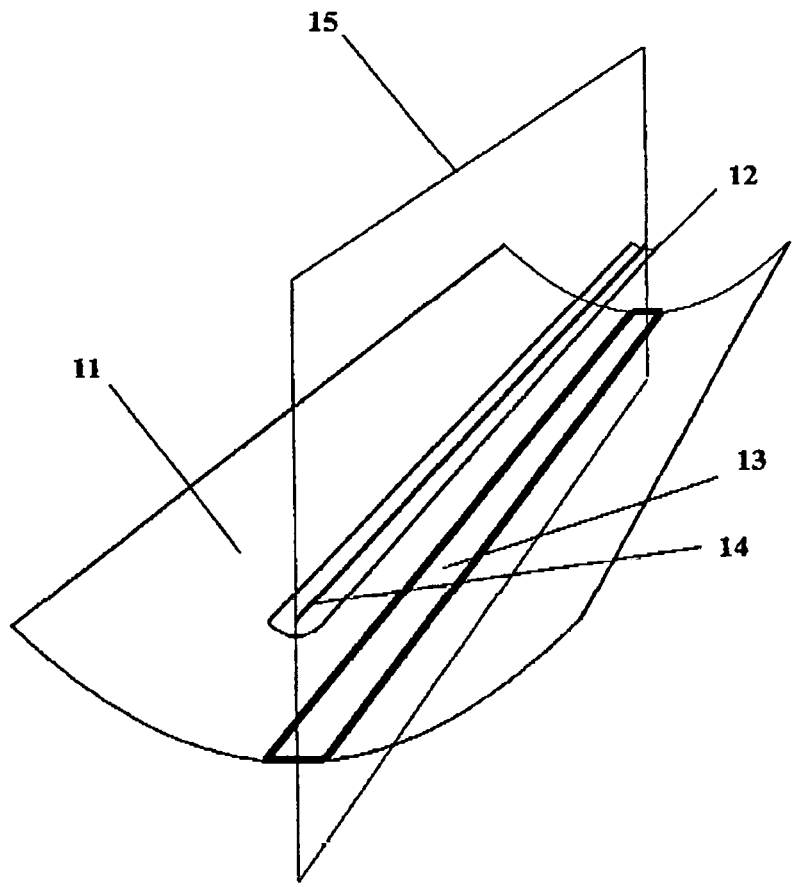
FIG. 1 shows the solar collector consisting of concave and convex reflecting surfaces that concentrate solar rays substantially in the plane of symmetry onto a line of photovoltaic cells.

FIG. 1 illustrates the preferred embodiment of the basic solar collection element consisting of an elongated concave reflecting surface, 11, having a focal line, 14, coincident with the focal line of a smaller convex reflecting surface, 12. In this figure the concave reflecting surface is facing upwards and the convex reflecting surface is facing downwards. When this collection element is aligned such that the rays of the sun are parallel to the common plane of symmetry bisecting these reflective surfaces, 15, the rays are focused on the photovoltaic cells, 13, which are arranged in a line at the bottom of the concave reflecting surface extending for a short distance either side of the plane of symmetry where it intersects the concave reflecting surface. The distance the photovoltaic cell area extends on each side of the plane of symmetry is given by the half-width of the concave reflecting surface divided by the ratio of the focal length of the concave reflecting surface divided by the focal length of the convex reflecting surface. This ratio is just the light flux concentration factor ignoring the shading effect of the convex reflecting surface.

Note that diffuse sky light also illuminates the photovoltaic cells directly without reflecting off the concave surface. Furthermore, diffuse sky light entering the collector from any direction that is in the plane of symmetry of the collector will also be concentrated by the same factor as direct sunlight. Thus this collector also effectively converts diffuse skylight into electrical energy. This is an improvement over many concentrating collectors that do not effectively convert diffuse skylight.

Figure 2A:
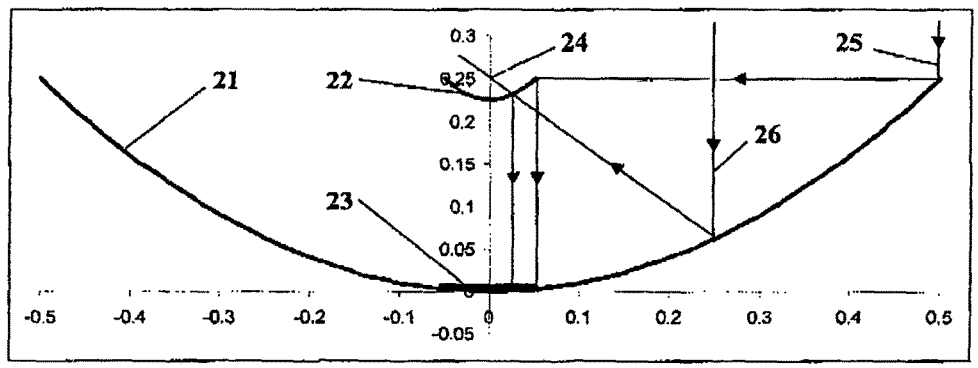
FIG. 2A and FIG. 2B show the cross-sections of the solar collector in a plane perpendicular to the coincident lines of focus for the concave and convex reflecting surfaces for 10:1 and 5:1 geometrical concentration factors respectively.

FIG. 2A is a cross-section of the solar collection element in a plane perpendicular to the line of focus of the concave and convex reflective surfaces. This plane will be referred to as the x-y plane with the y-axis in the vertical direction and the x-axis in the horizontal direction. A parabolic reflecting surface is required to focus all rays parallel to the y-axis at a single point with no spherical aberration. FIG. 2A shows an example in which the equation for the concave reflecting surface, 21, in the x-y plane is $y_1=x^2$. The equation for the convex reflecting surface, 22, is $y_2=10x^2+0.225$. These are equations for parabolas with their axes of symmetry coincident with the y-axis. The equation for $y_1$ is plotted for $-0.5<x<0.5$. The equation for $y_2$ is plotted for $-0.05<x<0.05$. Light rays in this x-y plane parallel to the y-axis will all be focused at the same point on the y-axis (x=0, y=0.25). This can be seen by taking the derivatives of $y_1$ and $y_2$ and finding the value of x at which the derivative is equal to 1:

$dy_1/dx=2x$ (At $x=0.5, dy_1/dx=2*0.5=1$)

$dy_2/dx=20x$ (At $x=0.05, dy_2/dx=20*0.05=1$)

A slope of 1 at x=0.5 for the function, $y_1$, means that the focal point for the surface defined by $y_1$ is located at y=0.25. This can be seen by the fact that the angle of incidence for a reflected ray relative to the normal to that surface is equal to the angle of reflection. This means that the incoming ray, 25, parallel to the y-axis reflected from the surface $y_1$ at the point x=0.5 would be reflected parallel to the x-axis and the focal point would be at (x=0, y=0.25) since $y_1(x=0.5)=0.25$.

Similarly the focal point for the convex reflecting surface can be shown to be at the same point (x=0, y=0.25) since the slope of the function $y_2$ is equal to 1 at x=0.05 and $y_2(x=0.05)=10*0.05^2+0.225=0.025+0.225=0.25$.

This means that ray, 25, in FIG. 2A is directed towards the focal point, 24, in a horizontal direction. At the point (x=0.05, y=0.25) it is intercepted by the convex reflecting surface, 22, and reflected parallel to the y-axis to the photovoltaic cell, 23, striking it at it's edge located at x=0.05.

As it enters the concave surface, ray, 26, has an x-coordinate of 0.25. It strikes the concave reflecting surface at x=0.25 and is reflected towards the focal point at (x=0, y=0.25). It intercepts the convex reflecting surface, 22, at point (x=0.025, y=10*0.025^2+0.225) and is reflected parallel to the y-axis striking the photovoltaic cell at position x=0.025. Rays parallel to the y-axis between rays 25 and 26 would strike the photovoltaic cell between x=0.025 and x=0.05. Similarly rays striking surface 21 between x=0.05 and x=0.25 would strike the photovoltaic cell at between x=0.005 and x=0.025. By symmetry rays between x=-0.05 and x=-0.5 would strike the photovoltaic cells between x=-0.005 and x=-0.05. This shows that the light intensity striking the photovoltaic cells over these ranges of coordinates is 10 times the flux entering the collector assuming a reflectivity of 1. If the concave, 21, and convex, 22, reflecting surfaces were perfect, the light intensity at the surface of the photovoltaic cell would drop near x=0 due to the shadowing effect of the convex reflecting surface. The intensity can be evened out by flattening the convex reflecting surface slightly. This is an advantage of this collector system. The optical surfaces do not need to be high quality. Some deviation from a perfect parabolic shape is actually desirable to distribute the light intensity more uniformly. This makes inexpensive fabrication possible. Taking the shadowing effect of the convex reflecting surface into account, the flux concentration ratio in FIG. 2A is 9x for a reflectivity of 1.

This simple ray analysis does not take into account diffraction effects. It is adequate however for practical dimensions of the collector and for the accuracy needed. Tolerances for the optics are very relaxed because the photovoltaic cells extend over a moderately large area.

Figure 2B:
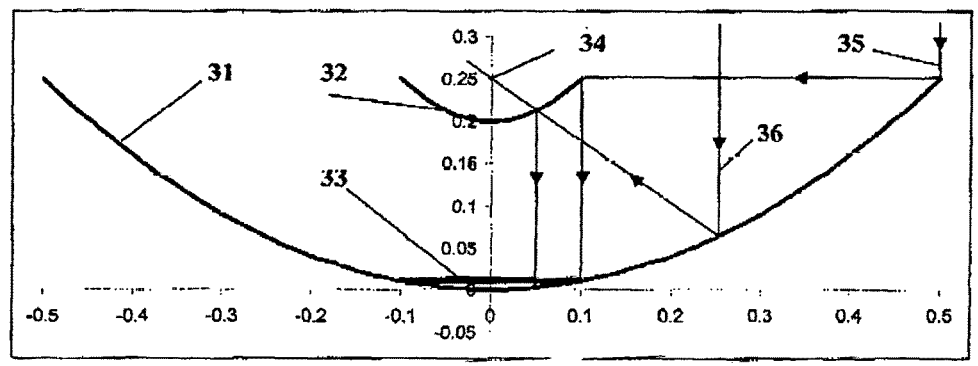

FIG. 2B shows another example with a flux concentration ratio of 4x for a reflectivity of 1 including the shadowing effect of the convex reflecting surface. The equation for the concave reflecting surface, 31, is the same $y_1=x^2$. The equation for the convex reflecting surface, 32, is $y_2=5x^2+0.20$. The focal point, 34, for both the concave and convex reflecting surfaces is the same (x=0, y=0.25). Ray, 35, is focused on the photovoltaic cell at x=0.1. Ray, 36, is focused on the photovoltaic cell at x=0.05. This yields a flux concentration ratio of 5x. The flux concentration ratio is just the ratio of the focal lengths of the concave and convex reflecting surfaces. The shadowing effect of the convex reflecting surface reduces this concentration ratio to 4:1.

Obviously the actual physical dimensions of the solar collector can be scaled to any appropriate dimensions. It is also possible to vary the angle subtended by the reflecting surfaces as seen from the focal point. For example, the concave reflecting surface, 21, in FIG. 2A could be removed for −0.25>x>0.25, the convex reflecting surface could be removed for −0.025>x>0.025, and the photovoltaic cell could be removed for −0.025>x>0.025. However, this would cause the convex reflecting surface to stick out well beyond the edges of the concave reflecting surface. This could have the deleterious effect of increasing the shadowing of adjacent collectors if taken to an extreme. Shadowing effects will be considered next. Scale factors would be chosen to optimize the size of the photovoltaic cells. The light flux concentration ratio would be selected to be as high as possible consistent with the electrical and lifetime constraints of the photovoltaic cells. Higher light fluxes enable more efficient use of the photovoltaic cells. Low optical quality requirements enable the reflector areas of the solar collectors to be much less expensive than the photovoltaic cell areas. This is one of the factors that improves the cost/Watt metric. The inherent low aspect ratio of this collector makes it possible to minimize the required depth of the solar panel.

Figure 5:
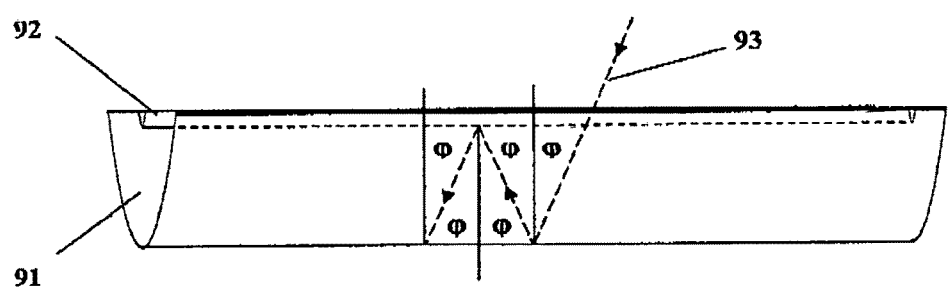
FIG. 5 shows the side view of the solar collector and traces the reflected path of a direct ray from the sun parallel to the plane of symmetry as well as the reflected path of a diffuse-skylight ray parallel to the plane of symmetry.

FIG. 5 illustrates the path of a solar ray, 93, in the z-dimension. The path of the ray in the z-dimension, which is parallel to the line of focus of the reflecting surfaces, can be considered independently of the path in the x-y plane. In the z direction the angle of reflection, $\phi$, is equal to the angle of incidence, $\phi$. This is true for reflections at the concave reflecting surface, 91, and at the convex reflecting surface, 92. The magnitude of the light flux at the surface of the solar cells is proportional to $\cos \phi$.

Figure 6:
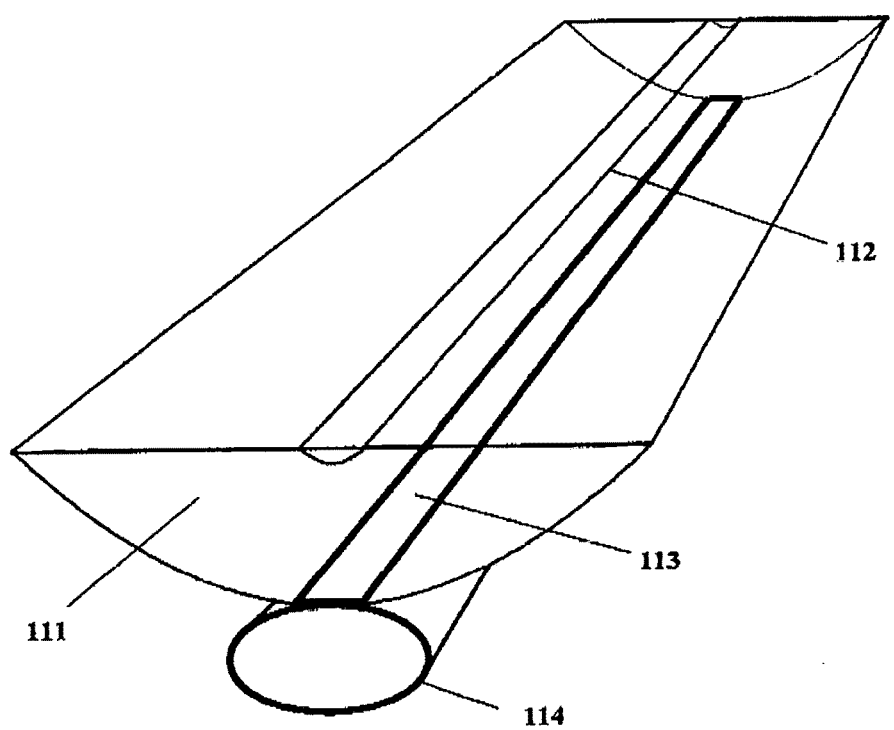
FIG. 6 shows how the photovoltaic cells can easily be connected to cooling tubes through a path of low thermal resistance.

FIG. 6 illustrates how an optional cooling line can be added to the solar collector. Concave reflecting surface 111 and convex reflecting surface 112 concentrate direct sunlight as before. A tube, 114, would be attached under the photovoltaic cells, 113. Good thermal contact between this tube and the photovoltaic cells insures effective cooling when a liquid is passed through the tube. Maintaining a good flow of heat away from the photovoltaic cells enables them to operate at higher light fluxes and higher peak power generation levels while maintaining adequate lifetime and reliability. The cooling liquid could be used to provide hot water or space heating thereby adding to the total economic value of the output of the solar panels.

Figure 3A:
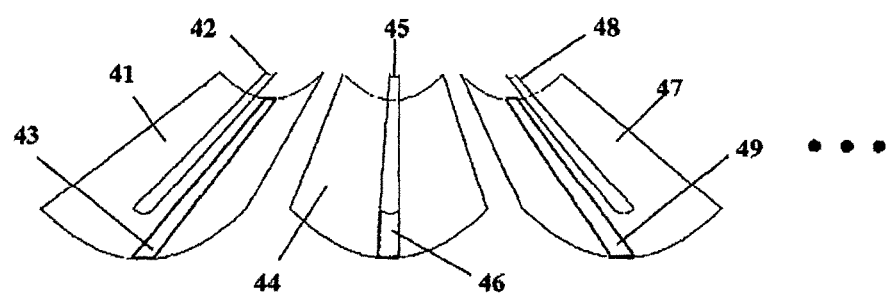
FIG. 3A illustrates how a plurality of solar collectors are arrayed in parallel to form a solar panel.
Figure 3B:
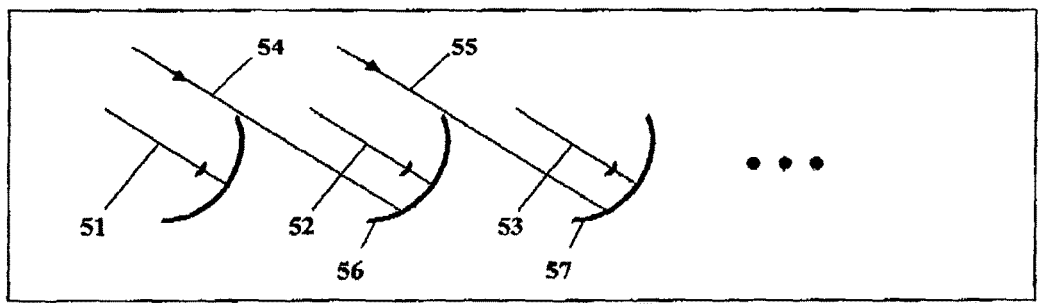
FIG. 3B and FIG. 3C show a plurality of solar collectors in cross-section with different spacings between collectors and how these spacings affect the light intensity impinging on the photovoltaic cells when solar rays have a low angle of incidence.

Operation of the Solar Collector in a Solar Panel—FIGS. 3A and 3B

FIG. 3A shows how individual solar collectors are arrayed together to form a solar panel. Three collectors are shown, but the number of collectors configured together to comprise a panel can be any number consistent with total size requirements. The collectors are arranged in parallel with their lines of focus typically aligned in a north-south direction, but this is not necessary. In FIG. 3A the first collector is comprised of a concave reflecting surface, 41, a convex reflecting surface, 42, and a line of photovoltaic cells, 43. The second collector is comprised of a concave reflecting surface, 44, a convex reflecting surface, 45, and a line of photovoltaic cells, 46. The third collector is comprised of a concave reflecting surface, 47, a convex reflecting surface, 48, and a line of photovoltaic cells, 49. The planes of symmetry bisecting each of these collectors are all parallel and the collectors all are rotated to an orientation that keeps the rays of the sun parallel to these planes of symmetry as shown in FIG. 3B. This orientation is maintained by a drive that tracks the sun for the entire time that it is above the local horizon.

FIG. 3B shows the three collectors of FIG. 3A in cross-section oriented to keep the sun's rays, 54 and 55, parallel to the bisecting planes of these collectors. The rays, 54 and 55, are actually the projection of the sun's rays on the plane of this cross-section, which is perpendicular to the lines of focus for each of the collectors. The z-component of the sun's rays perpendicular to the plane of this cross-section will be discussed later. Rays 54 and 55 are selected because they are the rays which are just grazing the upper edges of the first and second collectors respectively. The bisecting planes for each of the collectors intersect the plane of this cross-section in lines that are represented by line segments, 51, 52, and 53, for the first, second, and third collectors respectively numbered from left to right. The rays, 54 and 55, are parallel to the line segments, 51, 52, and 53. Note that the segment of the second concave reflector, 56, outside the ray, 54, would be shaded by the first concave reflector on its immediate left. Similarly, the segment of the third concave reflector, 57, would be shaded by the second concave reflector on its immediate left. This shading would reduce the average light flux on the photovoltaic cells and would reduce the electrical output proportionately. Obviously this shading effect becomes worse as the elevation of the sun decreases.

Figure 3C:
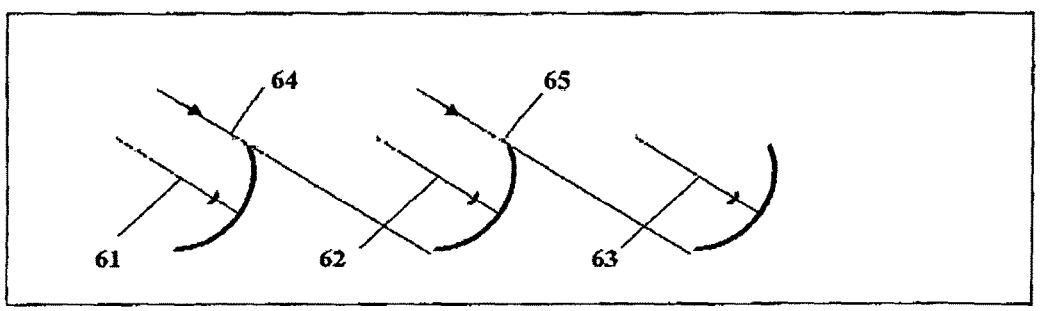

FIG. 3C illustrates how the shading effect can be reduced by increasing the spacing between the collectors. Rays 64 and 65 are parallel to line segments 61, 62, and 63 representing the lines of intersection of the bisecting planes for collectors 1, 2, and 3 labeled from left to right with the plane of this cross-section. Rays 64 and 65 have the same elevation with respect to the x-axis as rays 54 and 55 in FIG. 4B. These rays are grazing the upper edges of collectors 1 and 2. Note that the second and third collectors are no longer shaded by their neighbors to their immediate left. Obviously shading will still occur for even lower elevations of the sun in the x-y plane, but shading in FIG. 3C is reduced relative to FIG. 3B for all cases in which there is some shading for the collector spacings in FIG. 3B. This demonstrates that the average electrical power generated by each collector can be increased by increasing the spacing between the collectors. This increase in average power generated is at the expense of lower area efficiency. When the elevation of the sun is sufficiently high some of the solar flux falls in between the collectors and is lost for power generation. For many applications better cost efficiency for the electrical energy generated is a good tradeoff for lower area efficiency. This invention allows this tradeoff for applications for which this is an advantage.

Advantages of the Preferred Embodiment of the Solar Collector

This preferred embodiment achieves the key goal of minimizing the cost/Watt for electrical power generation. It accomplishes this by enabling an optimized combination of maximum light concentration factor consistent with lowest manufacturing cost. This is possible because the optical and tracking systems are simple and flexible. The optical quality requirements are low because the allowed tolerances are very relaxed. Furthermore this preferred embodiment is very robust. It is compatible with the form factor of a 1-sun solar panel and it can be used wherever this generic panel is used. It does not require expensive unsightly mounts that are much more susceptible to damage and malfunction.

Figure 4A:
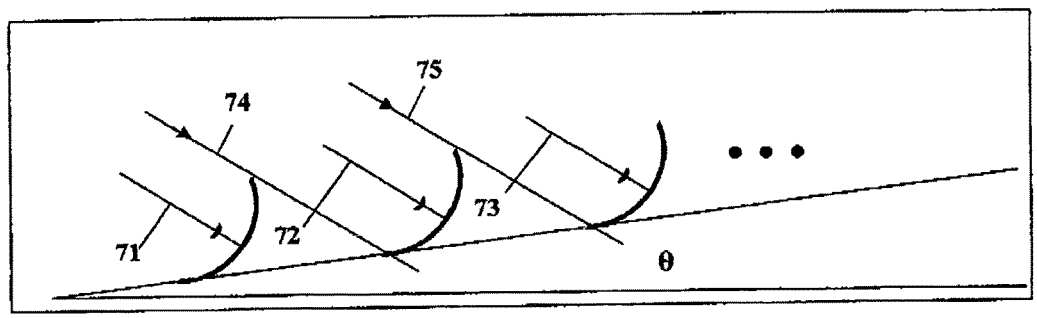
FIGS. 4A and 4B show how the light intensity impinging on the photocells can be increased by tilting the plane of the solar collectors for low angles of incidence from the left and from the right.
Figure 4B:
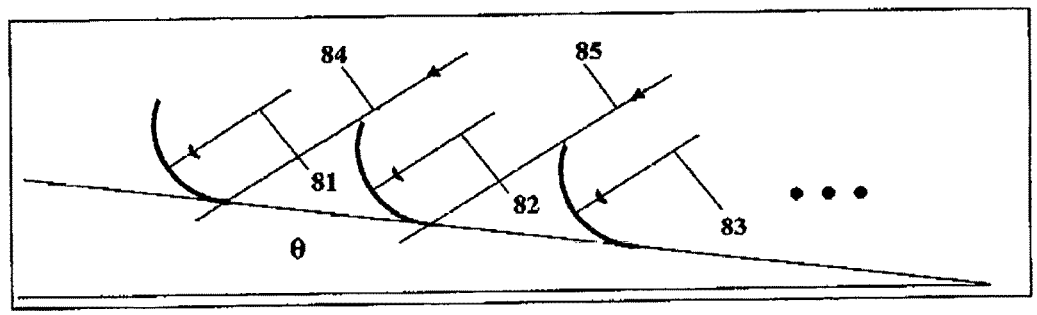

Solar Collector Arrangement to Minimize Shadowing Effects—FIGS. 4A and 4B

FIGS. 4A and 4B illustrate how shading can also be reduced by tilting the plane of the collectors through an angle, $\theta$, with respect to the base of the solar panel. In FIG.

4A the spacings of the collectors and the elevation of the sun relative to the base of the solar panel are the same as in FIG. 3A. Rays 74 and 75 have the same angle of intersection with the base of the panel. These rays are parallel to the line segments, 71, 72, and 73 representing the planes that bisect the concave and convex reflecting surfaces for collectors 1, 2, and 3 respectively. Tilting the plane of the collectors through an angle, θ, eliminates the shading effect of collectors 1 and 2 on collectors 3 and 4 respectively from left to right. The effective depth of the solar panel must be increased as the angle, θ, is increased. Larger values of θ enable greater increases in power production for low elevations of the sun. If larger panel effective thicknesses can be allowed then better power efficiencies can be achieved.

FIG. 4B shows the orientation of the plane of the collectors when the sun is at low elevations Post Meridian assuming that Figure A shows the orientation Ante Meridian and the focal line of the concave and convex reflecting surfaces are oriented in a north-to-south direction with East to the left. In FIG. 4B the spacings of the collectors and the elevation of the sun relative to the base of the solar panel are the same as in FIG. 3A. Rays 84 and 85 have the same angle of intersection with the base of the panel although from the opposite direction with respect to the x-axis. These rays are parallel to the line segments, 81, 82, and 83 representing the planes that bisect the concave and convex reflecting surfaces for collectors 1, 2, and 3 respectively. The stepping motor control for the orientation of the collectors can be programmed for the two possible positions of the plane of the collectors to maintain proper orientation of the collectors with respect to the sun. If a servo is used to continuously maximize the electrical output of the solar panel, it will automatically compensate for the tilt of the plane of the collectors.

Solar Panel Operation with Minimized Shadowing Effects—FIGS. 4*a* and 4B

For a given spacing and configuration of solar collectors in a solar panel there will be a limiting angle at which shadowing will start to occur. Lower angles of incidence will result in progressively more shadowing. This limit can be detected with a limit switch which would signal the drive mechanism to toggle the tilt plane to minimize shadowing for these low angles of incidence.

Advantages of Solar Panel Operation with Minimized Shadowing Effects

This enhancement to the configuration of the solar collectors within the solar panel increases the electrical energy conversion in the early daylight hours and in the late daylight hours. Complication of the drive mechanism is minimal.

CONCLUSION, RAMIFICATIONS, AND SCOPE

This invention minimizes the cost/Watt of electrical energy generated including capital equipment expense plus installation and maintenance. Capital expense is minimized because the light concentration ratio can be optimized for maximum leveraging of the photovoltaic cells consistent with very low-cost manufacture of the collectors and the drive mechanism. Installation is no different from installation of a generic 1-sun solar panel. Maintenance is comparable since the drive mechanism is very simple and robust. It also provides maximum flexibility for variations in installation sites and can be used for any and all applications including residential, commercial, and industrial. There are no limitations imposed by weather or aesthetic considerations.

Flexibility is a key attribute of this invention that enables these advantages; consequently, examples presented should not be construed as limiting the scope of this invention. Concentration ratios can be varied over a wide range. Scale of the reflecting surfaces, the photovoltaic cells, and the solar panels can vary over a very wide range from small to large. Deviations of the cross-sections of reflecting surfaces from true parabolas can be employed to improve efficiency. The angle subtended by the concave and convex reflecting surfaces at the focal line can be varied to maximize cost efficiency and/or vary the panel depth requirements. The material used for constructing the reflecting surfaces can be varied in order to achieve the minimum manufacturing cost. This includes use of reflective coatings on transparent materials such as glass.

The invention claimed is:

1. A solar panel having a base with a fixed location and fixed orientation as installed and a footprint compatible with standard solar panels and comprised of concentrating solar collectors supported by an adjustable mount attached to said base and with said solar collectors arrayed in parallel to each other in a single common plane with each solar collector having:

a. a first long concave reflecting surface having width, W1, and an area, A1, when projected onto a plane perpendicular to incoming parallel rays of the sun that concentrates incoming parallel rays of the sun onto a focal line, and b. a second long reflecting surface having width, W2, and an area, A2, when projected onto a plane perpendicular to incoming parallel rays of the sun with W2<W1 and A2<A1 that reflects all of said concentrated rays from said first long concave reflecting surface in a direction parallel to said incoming parallel rays from the sun striking said first concave reflecting surface and directs these concentrated parallel rays directly onto c. a narrow line of photovoltaic cells located within the concave arc of said first reflecting surface or in immediate proximity to said arc at normal incidence when projected onto a plane perpendicular to the length of said long reflecting surface and having a width equal to said width of said second long reflecting surface, W2, in order to intercept all of said concentrated parallel solar rays reflected from said second long reflecting surface, and d. said second long reflecting surface is convex and has a plane of bilateral symmetry that contains its focal line and is parallel to incident rays from the sun, and e. said second long convex reflecting surface has a cross-section in a plane perpendicular to said focal line that is parabolic in shape with a width in said plane of W2, and f. said first long concave reflecting surface has a cross-section in a plane perpendicular to said focal line that is parabolic in shape, and g. said first long concave reflecting surface has a plane of bilateral symmetry coincident with said plane of bilateral symmetry of said second long reflecting surface and a focal line coincident with said focal line of said second long reflecting surface, and h. said second long reflecting surface directs incoming rays from the sun that are parallel to said common plane of symmetry into a beam of rays parallel to said plane of symmetry and parallel to said incoming rays from the sun and directs this beam directly onto said narrow line of photovoltaic cells at normal incidence when projected on a plane perpendicular to the length of said second long reflecting surface, and i. said second convex reflecting surface has a focal length, L2, that is smaller than the focal length, L1, of said first concave surface and the focal length ratio L2/L1 is equal to W2/W1 and A2/A1, and j. said narrow line of photovoltaic cells extends for an equal distance either side of said plane of symmetry and has a width, WP, that is equal to said width of said second reflecting surface measured in a plane perpendicular to the length of said second long reflecting surface, WP=W2, and k. said narrow line of photovoltaic cells having width, WP, equal to W2 is located within the concave arc of said first reflecting surface or in immediate proximity to said arc centered on the line of intersection of said first long concave reflecting surface with said plane of symmetry, and l. reflected rays from said second reflecting surface are incident directly on said narrow line of photovoltaic cells at normal incidence when projected on a plane perpendicular to said focal line, and m. said solar collector has an axis of rotation that is parallel to said coincident focal lines and lies in said plane of bilateral symmetry, and n. said solar collector has a height-to-width ratio of 1:4 where the height is equal to said focal length of said first reflecting surface, L1, and the width is equal to said width of said first reflecting surface, W1, (L1/W1=1/4), and whereby, the area of said narrow line of photovoltaic cells, A2, is reduced in the ratio of said width of said second reflecting surface to said width of said first reflecting surface, W2/W1=A2/A1=L2/L1, while generating electrical power equal to (1−W2/W1) times that generated by photovoltaic cells without the benefit of concentration having a cross-sectional area when projected onto a plane perpendicular to incoming parallel rays of the sun equal to said area of said first reflecting surface, A1, and the area and cost of said photovoltaic cells is reduced by said ratio, W2/W1, and whereby said solar collector height-to-width ratio of 1:4 minimizes solar collector construction materials and enables minimum spacing of said solar collectors while achieving compatibility with 180-degree rotation of said solar collectors, as arrayed in parallel on said mount which mount can be adjusted to intercept an optimal flux of solar radiation by minimizing the angle between the normal to said common plane of said solar collectors and the incident solar rays.

2. The solar panel of claim 1 wherein said concentrating solar collectors are modified such that:

a. said second convex reflecting surface has a cross-section that is distorted slightly from a parabolic shape by reducing the distance between the original focus and the convex reflecting surface at its intersection with said bisecting plane to produce reflected rays from said second convex reflecting surface having an acute angle of convergence towards said plane of bilateral symmetry equal to arctan $[2*(L2/L1)^2/(1-L2/L1)]$ relative to the incoming parallel rays from the sun in the x-y plane perpendicular to said focal line, and whereby the light intensity across said width of said narrow line of photovoltaic cells is evened out by compensating for the obscuration caused by said second convex reflecting surface which otherwise would cause a partial shadow near the center line of said narrow line of photovoltaic cells.

3. The solar panel of claim 1 wherein said concentrating solar collectors are modified such that:

a. said focal length, L2, and the position of said focal line of said second convex reflecting surface relative to said focal line of said first concave reflecting surface are adjusted to produce reflected rays from said second convex reflecting surface having an acute angle of convergence towards the plane of symmetry equal to arctan $[2*(L2/L1)^2/(1-L2/L1)]$ relative to the incoming parallel rays in the x-y plane perpendicular to said focal line, and whereby the surface configuration of said second reflecting surface is explicitly and unambiguously determined by the principles of ray optics based on the specified angle of convergence and the result is more uniform illumination of said narrow line of photovoltaic cells since the shadowing effect of said second reflecting surface is reduced resulting in better conversion efficiency of the photovoltaic cells and overall conversion efficiency of the solar collector is optimized.

4. The solar panel of claim 1 having:

a. said solar collectors arranged in parallel side-by-side along their long sides such that said axes of rotation of all solar collectors are parallel to each other and are contained in the same plane, and b. said adjustable mount supporting said solar collectors inside said solar panel incorporates a first detent mechanism, which holds said plane of said solar collectors in a position that is tilted in a first direction with respect to said base of said solar panel such that said plane forms an angle, θ, with respect to said base of said solar panel, and c. said adjustable mount supporting said solar collectors inside said solar panel incorporates a second detent mechanism, which holds said plane of said solar collectors in a position that is tilted in a second opposite direction with respect to said base of said solar panel such that said plane forms an angle, θ, with respect to said base of said solar panel, and d. said adjustable mount supporting said solar collectors inside said solar panel incorporates a third detent mechanism, which holds said plane of said solar collectors in a position that is parallel to said base of said solar panel, and e. said plane of said solar collectors has three possible distinct and discrete positions, corresponding to said tilt in said first direction, said tilt in said second direction, and no tilt with respect to said base of said solar panel, and whereby said plane of said solar collectors has three distinct possible orientations in said solar panel that must be selected to maximize electrical energy conversion depending on the angle of incidence of solar rays by selecting the detent position of said mount that minimizes the angle of incidence of solar rays relative to the normal to said plane of said solar collectors.

5. The solar panel of claim 4 further including:

a. a drive that is operated by a controller that is programmed to maintain the sun in said plane of bilateral symmetry of each of said solar collectors as a function of time of day and time of year by rotating each of said solar collectors about said axis of rotation, and b. said drive controller adjusts the orientation of said plane of said solar collectors by selecting one of said three detent positions which achieves the smallest angle of incidence of solar rays with respect to the normal to said plane of said solar collectors, and c. said drive controller is programmed to compensate the angle of rotation of said solar collectors whenever the orientation of said plane of said solar collectors is switched from one discrete orientation to another discrete orientation by rapidly slewing the angle of rotation of said solar collectors through a complementary angle to compensate for the change in angle caused by the change in orientation of said plane of solar collectors, and whereby the electrical output of said narrow lines of photovoltaic cells is continuously maximized by centering the concentrated light from said second long reflecting surface on said narrow line of photovoltaic cells and said plane of said solar collectors intercepts a larger cross section of the incident solar light flux thereby minimizing the effects of shadowing on individual solar collectors and maximizing the electrical energy converted at specific times of day and specific times of the year when shadowing of one solar collector by another would otherwise reduce the level of electrical power generation.

6. The solar panel of claim 4 further including:

a. a drive that is operated by a servo controller incorporating a feedback loop that continuously maintains the sun in said bilateral planes of symmetry of each of said solar collectors by rotating each of said solar collectors about said axis of rotation, and b. said drive adjusts the orientation of said plane of said solar collectors by selecting one of said three detent positions which achieves the smallest angle of incidence of solar rays with respect to the normal to said plane of said solar collectors, and c. said drive controller automatically compensates the angle of rotation whenever the orientation of said plane of said solar collectors is switched from one discrete orientation to another discrete orientation by rapidly slewing the angle of rotation of said solar collectors through a complementary angle to compensate for the change in angle caused by the change in orientation of said plane of axes, and whereby the electrical output of said narrow lines of photovoltaic cells is continuously maximized by centering the concentrated light from said second long reflecting surface on said line of photovoltaic cells and said plane of said solar collectors intercepts a larger cross sectional area of the incident solar light flux thereby minimizing the effects of shadowing on individual solar collectors and maximizing the electrical energy converted at specific times of day and specific times of the year when shadowing of one solar collector by another would otherwise reduce the level of electrical power generation.

* * * * *